(12) United States Patent
Nica et al.

(10) Patent No.: US 10,540,456 B2
(45) Date of Patent: Jan. 21, 2020

(54) METHOD FOR ASSESSING THE CONTROLLABILITY OF A VEHICLE

(71) Applicant: AVL LIST GMBH, Graz (AT)

(72) Inventors: Mihai Nica, Graz (AT); Christian Miedl, Offenberg (DE); Theodor Sams, Graz (AT); Franz Zieher, Graz (AT); Gerhard Griessnig, Graz (AT); Dirk Geyer, Leonberg (DE); Cheng Caizhen, Graz (AT); Thomas Rosenberger, Zwaring-Pöls (AT); Stephen Jones, Graz (AT); Jürgen Braun, Laaber (DE); Kural Emre, Graz (AT); Johannes Schauer, Graz (AT); Rolf Albrecht, Graz (AT)

(73) Assignee: AVL List GmbH, Graz (AT)

( * ) Notice: Subject to any disclaimer, the term of this patent is extended or adjusted under 35 U.S.C. 154(b) by 662 days.

(21) Appl. No.: 14/651,079

(22) PCT Filed: Dec. 3, 2013

(86) PCT No.: PCT/EP2013/075354
§ 371 (c)(1),
(2) Date: Jun. 10, 2015

(87) PCT Pub. No.: WO2014/090631
PCT Pub. Date: Jun. 19, 2014

(65) Prior Publication Data
US 2015/0310145 A1 Oct. 29, 2015

(30) Foreign Application Priority Data
Dec. 12, 2012 (AT) .............................. A 50584/2012

(51) Int. Cl.
*G06F 17/50* (2006.01)
*G01M 17/007* (2006.01)
(Continued)

(52) U.S. Cl.
CPC ....... *G06F 17/5009* (2013.01); *B60W 30/095* (2013.01); *B60W 40/08* (2013.01);
(Continued)

(58) Field of Classification Search
None
See application file for complete search history.

(56) References Cited

U.S. PATENT DOCUMENTS
5,880,362 A 3/1999 Tang et al.

FOREIGN PATENT DOCUMENTS
EP 2246686 11/2010

OTHER PUBLICATIONS

Irmscher et al. "Driver Classification Using ve-DYNA Advanced Driver" 2004, SAE Technical Paper Series 2004-01-0451, 8 pages.*
(Continued)

*Primary Examiner* — Suzanne Lo
(74) *Attorney, Agent, or Firm* — Dykema Gossett PLLC

(57) ABSTRACT

The invention relates to a method the assessing the controllability of a vehicle by a driver in a risky or problematic situation. In order to carry out assessment of the controllability of a vehicle early, the following steps are provided: a. modelling the drive train and the movement dynamics of the vehicle, b. modelling situation conditions and environmental conditions, c. selecting a risky or problematic situation, d. selecting a driver capability type, e. modelling the driver's reaction as a function of the selected driver capability type. f. simulating the dynamic vehicle behaviour in the longitudinal and transverse directions of a planned trajectory on the basis of the drive train model and movement dynamics model for the predefined situation and environmental conditions when the selected risky or problematic situation occurs, g. calculating the maximum lateral and longitudinal deviation from the planned trajectory between the occur- (Continued)

rence of the risky or problematic situation and the regaining of complete control by the driver, h. evaluating the controllability of the vehicle by the driver in the risky or problematic situation on the basis of the maximum lateral and/or longitudinal deviation.

11 Claims, 2 Drawing Sheets

(51) Int. Cl.
  *G01M 17/06*   (2006.01)
  *G09B 9/052*   (2006.01)
  *G01M 17/04*   (2006.01)
  *G09B 9/058*   (2006.01)
  *B60W 30/095*   (2012.01)
  *B60W 40/08*   (2012.01)
  *B60W 50/00*   (2006.01)

(52) U.S. Cl.
  CPC .......... *G01M 17/007* (2013.01); *G01M 17/04* (2013.01); *G01M 17/06* (2013.01); *G09B 9/052* (2013.01); *G09B 9/058* (2013.01); *B60W 2050/0029* (2013.01); *B60W 2050/0031* (2013.01)

(56) References Cited

OTHER PUBLICATIONS

Ma et al. "Study on Real-Time Simulation System of Vehicle Dynamics Via ve-DYNA", 2006, IEEE, pp. 454-458.*
Triggs et al. "Reaction Time of DRivers to Road Stimuli" Jun. 1982, 68 pages.*
Hommes, Qi Van Eikema "Assessment of the ISO 26262 Standard, "Road Vehicles—Functional Safety"" Jan. 25, 2012, 19 pages.*
Xiong et al. "Vehicle dynamics control of four in-wheel motor drive electric vehicle using gain schedule based on tyre cornering stiffness estimation", Mar. 1, 2012, International Journal of Vehicle Mechanics and Mobility, vol. 50 Issue 6, 4 pages, Abstract.*
Tesis Dynaware GmbH, Professional Real-Time Vehicle Dynamics Simulation Environment, Dec. 1, 2012, pp. 1-4.

* cited by examiner

METHOD FOR ASSESSING THE CONTROLLABILITY OF A VEHICLE

The invention relates to a method for evaluating the controllability of a vehicle, especially an electric vehicle, by a driver in risky or problematic situations.

ISO standard 26262 was introduced in order to enable the systematic assessment of the risk in the case of dangerous errors in electrical and electronic systems in vehicles. Preconditions which need to be fulfilled are mentioned in the standard, so that the system to be developed can fulfil a required safety requirement level ASIL (automotive safety integrity level). In this respect, the requirements concerning the performance of a hazard analysis and risk assessment are defined. For this purpose, the potential hazards of the system must be identified at first. This occurs by considering the malfunctions of the examined system in specific driving situations. Subsequently, each hazard is classified by a safety requirement level ranging from A to D, or it is assessed as not being safety-relevant. The risk analysis occurs in the ISO standard 26262 by means of a fixed qualitative methodology. For this purpose it is necessary to individually assess for each identified hazard the severity (severity—S) of the effect, the frequency (exposure—E) of the driving situation and the controllability (controllability—C) of the malfunction in the respective driving situation for example by the driver. The requirements placed on the safety increase with rising safety requirement level ASIL, which is why the safety requirement level has a strong influence on the development costs.

Whereas there are clear guidelines for the assessment of the severity of the effects and the frequency of the driving situation, the controllability of the driving situation was difficult to assess in an objective manner up until now. In accordance with the ISO standard 26262, the controllability of the driving situation is divided into the classes C0 (controllable) to C3 (uncontrollable). The problem occurs that most controllability assumptions are only verifiable at the end of the development cycle on the test stand by way of a suitable examination. It is especially aggravating when it is recognised that the controllability was assumed incorrectly during the project and the safety requirement level of the system needs to be newly defined, so that parts of the development work need to be repeated.

It is the object of the invention to avoid these disadvantages and to develop a method which allows carrying out an assessment of the controllability of a vehicle at an early stage.

This is achieved in accordance with the invention by the following steps:
a. modelling the drive train and the driving dynamics of the vehicle;
b. modelling situational and environmental conditions;
c. selecting at least one risky or problematic situation;
d. selecting at least one driver capability type, preferably from the group of inexperienced drivers, average drivers and experienced drivers;
e. modelling the reaction of the driver as a function of the selected driver capability type;
f. simulating the dynamic vehicle behaviour in the longitudinal and transverse directions of a planned trajectory on the basis of the drive train model and driving dynamics model for the predetermined situational and environmental conditions when the selected risky or problematic situation occurs, under the assumption of driver intervention with a reaction time which is dependent on the driver capability type;
g. calculating the maximum lateral and longitudinal deviation from the planned trajectory between the occurrence of the risky or problematic situation and the regaining of the complete control by the driver;
h. evaluating the controllability of the vehicle by the driver in the risky or problematic situation on the basis of the maximum lateral and/or longitudinal deviation of the vehicle from the planned trajectory.

The present method allows the early assessment of the controllability of the vehicle by the driver in risky and problematic situations in the risk and problem analyses, as well as making statements on the reaction time in the case of an error in the system. It is the major advantage that the controllability of the vehicle can already be considered in a very early development phase. The method is based on simulations of the lateral and longitudinal driving dynamics of the vehicle for a large variety of driving conditions (e.g. dry, wet or icy roads; speeds; curves; etc), wherein a whole range of errors can be considered with respect to the system under review (e.g. errors in the electrical machine in an electric vehicle). The reaction capability of the driver under occurring problems can be examined on the basis of the result of the simulation.

In addition, the results of the simulation can be used for safety examinations.

Hazard analysis and risk assessment are performed according to ISO standard 26262. On the basis of the standard, relevant risky and problematic situations are selected for performing the simulation, e.g. for full torque release in a curve. A full description of the situation or conditions such as the driving speed, the real conditions, the visual conditions, the weather conditions, etc is additionally performed for error definition for each of these situations.

The drive train of the vehicle is modelled with suitable software tools (e.g. software "AVL CRUISE"). If a complex system such as a drive train is analysed, other tools can be used for modelling sub-components and can be integrated in the drive train model.

The modelling of the vehicle dynamics and the simulation of the situational conditions can be carried out by a software tool which enables a simulation of the lateral and longitudinal dynamics, e.g. with the driving dynamics simulation platform "CARMAKER" (IPG).

Several controllability types of drivers are modelled: inexperienced (according to the controllability level C0 of ISO standard 26262), average (according to the controllability level C1), and experienced (according to the controllability level C2). This driver modelling is realised by different reaction times for each driver model. In addition, the current reaction of the driver is modelled depending on the driver capability type. This means that an experienced driver will steer in the opposite direction more forcefully or apply a stronger braking force than an inexperienced or average driver.

Each situation is examined with respect to controllability or uncontrollability for each of the three driver capability types.

A risky or problematic situation is regarded as uncontrollable for risky or problematic situations with lateral action of force on the vehicle if during the period during which the driver tries to regain control of the vehicle the vehicle deviates at least by a defined limit value (e.g. 0.5 meters or more) from the intended driving route or the intended driving lane. Lateral deviation is understood to be the amount by which the lateral movement of the vehicle deviates from the planned trajectory, which lateral movement is caused by the risky or problematic situation. The limit value up to which the situation is regarded as controllable can be defined flexibly depending on the road. This limit value can be greater on motorways, but less than 0.5 meters on narrow roads, 0.5 meters can be assumed as the average limit value for most roads.

The controllability is measured in seconds (or metres) between two vehicles for risky or problematic situations with action of force on the vehicle longitudinally to the driving direction. The statutory regulations are used as reference values for the limit value in the country in which or for which the vehicle is developed. A two-second distance between two vehicles (or a respective distance in metres) is required in most European countries. A risky or problematic situation is regarded as controllable if the deviation in the longitudinal direction of the planned trajectory of the vehicle is not more than 1.5 seconds (0.5 seconds tolerance). The amount is understood as the longitudinal deviation by which the longitudinal movement of the vehicle, caused by the risky or problematic situation, deviates from the point on the trajectory planned by the driver. The longitudinal deviation depends on the simulated situation, i.e. the distance (e.g. two seconds) regarded as safe between two vehicles travelling behind each other, and can vary depending on the situation. The longitudinal deviation within which a risky or problematic situation is regarded as controllable is assumed with approximately 1 meter for stationary or starting vehicles.

If any of the lateral or longitudinal deviations lies above the respective limit value in the case of risky or problematic situations with both lateral and also longitudinal force components on the vehicle, a risky or problematic situation will be regarded as controllable if during the period in which the driver tries to regain control over the vehicle the lateral deviation does not exceed the lateral limit value (e.g. 0.5 meters) outside of the limits of the lane used by the vehicle or the longitudinal limit value (e.g. 1.5 seconds) from the point on the trajectory planned by the driver. A longitudinal limit value of 1 meter is assumed for a stationary or starting vehicle.

Depending on the driver capability types, the following reaction times are expected:

Inexperienced drivers (according to the controllability class C0): 2.3 to 2.8 seconds.

Average drivers (according to the controllability class C1): 1.8 to 2.1 seconds, Experienced drivers (according to the controllability class C0): 1.5 to 1.8 seconds.

A risky or problematic situation is regarded as uncontrollable (controllability class C3) if none of the driver capability types (according to the controllability classes C0, C1, C2) is capable of regaining the control over the vehicle again within the instituted limit values both for lateral deviation also for longitudinal deviation.

A risky or problematic situation is generally regarded as controllable (controllability class C0) if each of the driver capability types (according to the controllability classes C0, C1, C2) is capable of regaining the control over the vehicle within the instituted limit values both for lateral deviation and also for longitudinal deviation.

A risky or problematic situation is regarded as controllable on average (controllability class C1) if both the average and also the experienced driver capability type (according to the controllability classes C1, C2) is capable of regaining control over the vehicle within the instituted limit values both for lateral deviation and also for longitudinal deviation.

A risky or problematic situation is regarded as controllable on an experienced level (controllability class C2) if only the experienced driver capability type (according to the controllability classes C2) is capable of regaining control over the vehicle again within the instituted limit values both for lateral deviation and also for longitudinal deviation.

The lowest controllability class of all successfully simulated driver capability types gives a statement on the controllability of the vehicle in the selected risky or problematic situation. A hazard analysis and risk assessment according to ISO standard 26262 for example can be carried out on the basis of this result.

The invention will be explained in closer detail by reference to the drawings, which show schematically:

FIG. 1 shows the method in accordance with the invention for evaluating the controllability of a vehicle, e.g. an electric vehicle or a hybrid vehicle, by a driver in a risky or problematic situation, on the basis of a flowchart.

Figure 1:
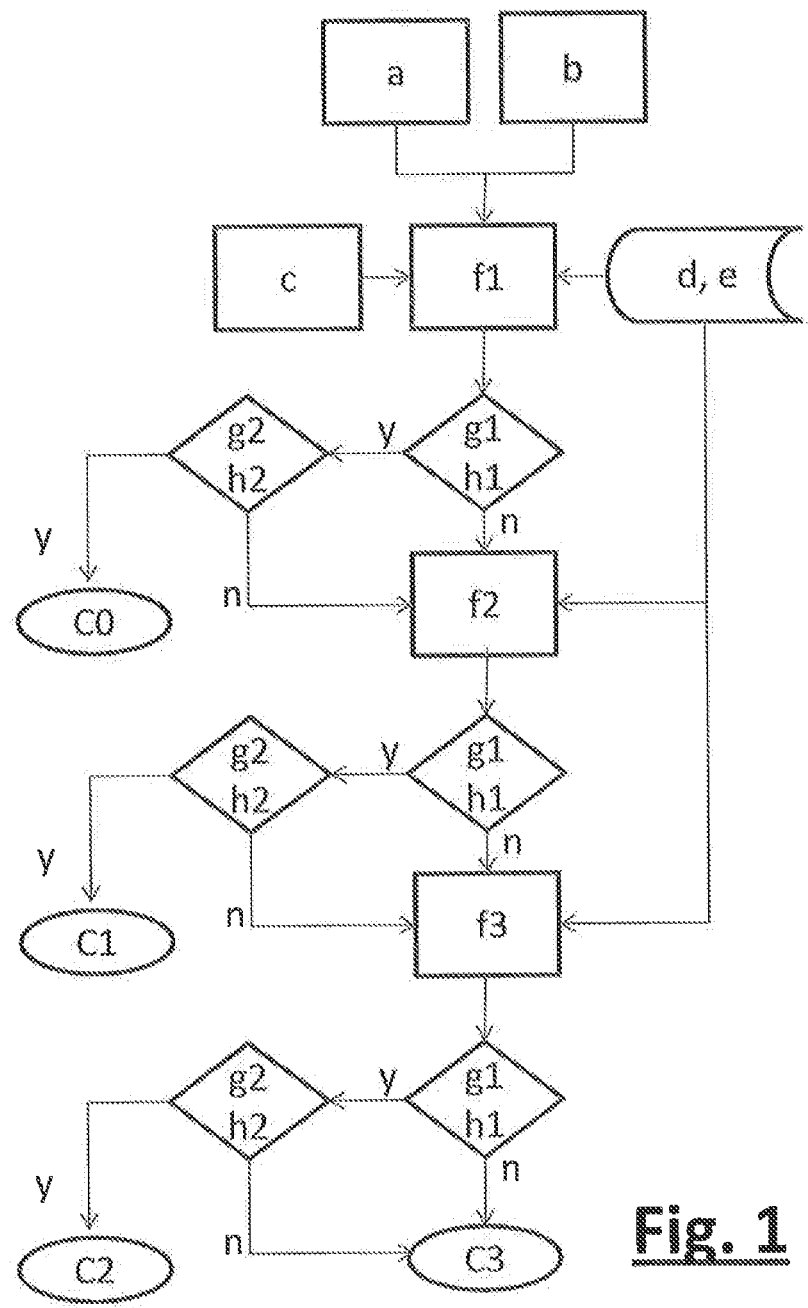
FIG. 1 shows the method in accordance with the invention in a flowchart.

After the start of the method, a modelling of the drive train and the driving dynamics is carried out in step a. The modelling of the drive train and drive train components can occur by means of suitable known software tools such as "AVL CRUISE" or the like.

In step b, a modelling of the situational and environmental conditions is carried out, wherein the situational and environmental conditions are defined completely. In this process, external factors such as the road condition, roughness of the road surface, visual conditions, weather conditions, time of day, temperature, etc are described. The modelling of the driving dynamics and the situational and environmental conditions can also be carried out by a software tool which enables a simulation of the lateral and longitudinal dynamics, e.g. by means of the driving dynamics simulation platform "CARMAKER" (IPG).

In step c, at least one risky or problematic situation is selected from a library or a table of stored potential risky and problematic situations, and respective information, parameters and routines for the simulation of the vehicle behaviour under occurrence of the risky or problematic situation are made available.

In step d, the driver capability type is selected from the group of inexperienced, average and experienced drivers, which group is stored as a table for example, and in step e the respective parameter such as the reaction time of the driver is made available in a modelling of the driver reaction depending on the driver capability type.

A simulation of the vehicle behaviour under occurrence of the risky or problematic situation is carried out in the steps f1, f2 and f3 for all driver capability types with the data and information from the steps a, b and c.

The simulation for an inexperienced driver is carried out at first in step f1. For this purpose, the maximum lateral deviation from the planned trajectory between the occurrence of the risky or problematic situation up to regaining complete control by the driver is calculated in step g1 and the maximum longitudinal deviation of the vehicle in step g2. Subsequently, it is evaluated in step h1 and h2 whether or not the driver controls the vehicle in this situation. This evaluation occurs on the basis of a comparison of the maximum lateral and longitudinal deviation of the vehicle in the risky or problematic situation from the planned trajectory point on the trajectory without the risky or problematic situation with a defined limit value for said deviation. The limit value for the lateral deviation from the directory can be 0.5 meters for example. The limit value for the longitudinal deviation can be assumed at 1.5 seconds, based on the minimum allowed distance of approx. 2 seconds between two vehicles driving behind each other. The limit values can also deviate from these values depending on the respective situation, the width of the road and the local statutory situation. In particular, the limit value for the longitudinal deviation can also be defined by a road distance.

If the evaluation h1 and h2 of this simulation leads to the result that the vehicle is controllable by the driver capability type of "inexperienced driver" ("y"), then the controllability class "C0" is output as a result of the controllability evaluation.

If however either the lateral or longitudinal deviation is greater than the allowed limit value, the vehicle is regarded as non-controllable ("n") for this driver capability type in the selected risky or problematic situations, and the simulation is continued with the next driver capability type of "average driver" in the same manner.

If the evaluation h1 and h2 of this simulation leads to the result that the vehicle is controllable by the driver capability type of "average driver" ("y"), the controllability class "C1" is output as the result of the controllability evaluation.

In the case of non-fulfillment of the limit values for the lateral or longitudinal deviation ("n"), the vehicle is regarded as uncontrollable for an average driver in this risky or problematic situation. In this case, the simulation is also continued for the last driver capability type of "experienced driver" in the manner as explained above.

If it is recognised in the continued simulation that the vehicle is controllable by the driver capability type of "experienced driver" ("y"), the controllability class "C2" is output as the result of the controllability evaluation. Otherwise, the vehicle is classified as uncontrollable with "C3" in the treated risky or problematic situation.

A risky or problematic situation is regarded as uncontrollable for risky or problematic situations with lateral action of force on the vehicle if during the time during which the driver tries to regain control over the vehicle the vehicle laterally deviates at least by a defined limit value of 0.5 meters for example from the intended driving route or the intended driving lane. Lateral deviation is understood to be the amount by which the lateral movement of the vehicle deviates from the planned trajectory, which lateral movement is caused by the risky or problematic situation. The limit value up to which the situation is regarded as controllable can be defined flexibly depending on the road. This limit value can be greater on motorways, but less than 0.5 meters on narrow roads. 0.5 meters can be assumed as the average limit value for most roads.

The controllability is measured in seconds (or metres) between two vehicles for risky or problematic situations with action of force on the vehicle longitudinally to the driving direction. The statutory regulations are used as reference values for the limit value in the country in which or for which the vehicle is developed. A two-second distance between two vehicles (or a respective distance in metres) is required in most European countries. A risky or problematic situation is regarded as controllable if the deviation in the longitudinal direction of the planned trajectory of the vehicle is not more than 1.5 seconds (0.5 seconds tolerance). The amount is understood as the longitudinal deviation by which the longitudinal movement of the vehicle, caused by the risky or problematic situation, deviates from the point on the trajectory planned by the driver. The longitudinal deviation depends on the simulated situation, i.e. the distance (e.g. two seconds) regarded as safe between two vehicles travelling behind each other, and can vary depending on the situation.

The longitudinal deviation within which a risky or problematic situation is regarded as controllable is assumed with approximately 1 m for stationary or starting vehicles.

If any of the lateral or longitudinal deviations lies above the respective limit value in the case of risky or problematic situations with both lateral and also longitudinal force components on the vehicle, a risky or problematic situation will be regarded as controllable if during the period in which the driver tries to regain control over the vehicle the lateral deviation does not exceed the lateral limit value (e.g. 0.5 meters) outside of the limits of the lane used by the vehicle or the longitudinal limit value (e.g. 1.5 seconds) from the point on the trajectory planned by the driver. A longitudinal limit value of 1 m is assumed for a stationary or starting vehicle.

The modelling of the reaction time of the driver, which is composed of the decision-making time, the actuation time and the response time of the actuating device, occurs as follows:

Since the driver is surprised by the risky or problematic situation, worst-case scenarios are considered.

The decision-making time includes the steps of perception, understanding, and selecting the reactive action.

The decision-making time can lie between a minimum and a maximum decision-making time. However, the actual decision-making time, depending on the respective situation and the level of attention of the driver, can also deviate therefrom.

Examinations have shown that in the case of an inexperienced driver (according to the controllability class C0) the minimum decision-making time can lie at 1.5 seconds and the maximum decision-making time can lie at approximately 2 seconds.

In the case of an average driver (according to the controllability class C1) the decision-making time can lie between a minimum decision-making time 1.2 seconds and a maximum decision-making time of 1.5 seconds.

The decision-making time lies for experienced drivers (according to the controllability class C2) between a minimum decision-making time of 1.0 seconds and a maximum decision-raking time of approximately 1.3 seconds.

The actuation time is the time between the selection of the actuation action and the actuation of the actuating device.

It can also be differentiated in this case too between the three driver capability types:

In the case of inexperienced drivers (according to the controllability class C0), the actuation time is generally 0.5 seconds, as examinations have shown.

In the case of average drivers (according to the controllability class C1), the actuation times is 0.3 seconds in most cases.

Experienced drivers (according to the controllability class C2) usually show actuation times of approximately 0.2 seconds.

The response time of the actuating device (e.g. the brake actuation device) is independent of the driver and depends on mechanical factors for example. It is in most cases approximately 0.3 seconds. An upward and downward deviation is possible depending on the state of the actuation device.

In summary, the following reaction times can be expected for example depending on the driver capability types:

Inexperienced drivers (according to the controllability class C0): 2.3 to 2.8 seconds.

Average drivers (according to the controllability class C1): 1.8 to 2.1 seconds.

Experienced drivers (according to the controllability class C0): 1.5 to 1.8 seconds.

The stated periods shall be understood as average values which are applicable in most cases. However, the periods can deviate in individual cases upwardly or downwardly from the stated values depending on the situation.

Example

Ambient conditions: wet rural road, speed of the vehicle 100 kmh, left curve; the vehicle comprises one electric motor per wheel;

Error: the electric motor of a front wheel suddenly supplies maximum positive e torque;

Modelled reaction times (assumption: no lead time, driver is completely surprised by the defect):
  a) controllability class C0: 2.8 seconds→an inexperienced driver is unable to control the vehicle (measures: foot away from the accelerator, attempt to brake, counter-steering—with longer delays)
  b) controllability class C1: 2.1 seconds→an average driver is unable to control the vehicle (measures: foot away from the accelerator, attempt to brake, counter-steering—with average delays)
  c) controllability class C1: 2.1 seconds→an average driver is unable to control the vehicle (measures: foot away from the accelerator, counter-steering—with short delays)

Result: situation is not controllable (C3)

Figure 2:
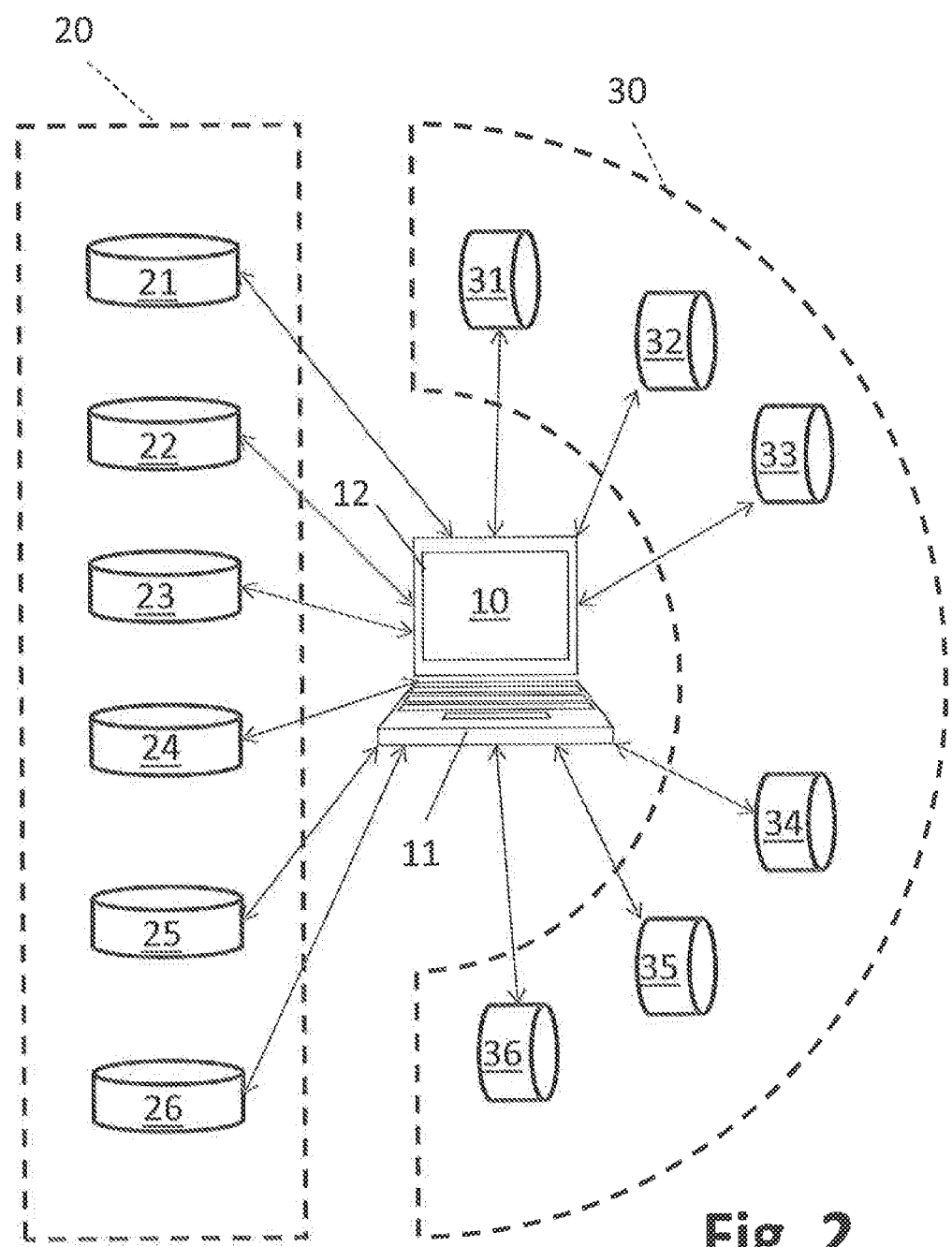
FIG. 2 shows a device for carrying out the method in accordance with the invention.

FIG. 2 shows a device for carrying out the described method for evaluating the controllability of a vehicle by a driver in at least one risky or problematic situation, comprising an operator control unit 10 with an input and output apparatus 11, 12, a processing unit 20 and a data unit 30. The operator control unit 10, the processing unit 20 and/or the data unit 30 can be integrated in a central unit or formed in a spatially separate manner, especially as a part of a decentralised computer network.

The processing unit 20 can consist of several program modules (software tools), e.g. a first program module 21 for modelling the drive train and drive train components (e.g. software AVL CRUISE), a second program module 22 for modelling the driving dynamics, a third program module 23 for modelling situational and environmental conditions, a fourth program module 24 for modelling the driver reactions depending on the driver capability type, a fifth program module 25 for simulating the dynamic vehicle behaviour on occurrence of the risky or problematic situation, and a sixth program module 26 for evaluating the controllability of the vehicle. At least two or more program modules can be combined in at least one program complex. For example, the second and third program module 22, 23 can be combined into a single program module for modelling the driving dynamics and the situational and environmental conditions. Such a functionality combining the second and third program modules is offered for example by the commercially available software tool "CARMAKER" (IPG).

The individual program modules 21, 22, 23, 24, 25 of the processing unit 20 can be arranged in a central unit or formed in a spatially separate manner as a part of a decentralised computer network.

The data unit 30 can comprise one or several data modules, e.g. a first data model 31 for information on risky and problematic situations, a second data module 32 for information on the vehicle and the drive train, a third data module 33 for information on situational and environmental conditions, a fourth data model 34 for information on the type of driver, a fifth data module 35 for driver-type-related reaction times, and a sixth data module 36 for defined limit values for the lateral and longitudinal deviation of the vehicle. At least two or more data modules can be combined in at least one data complex.

The individual data modules 31, 32, 33, 34, 35, 36 of the data unit 30 can be arranged in a central unit or formed in a spatially separate manner as a part of a decentralised computer network.

The data modules contain all the required information and criteria as characteristics, characteristic diagrams, tables or matrices, and/or can be entered or supplemented during the process. The respective data and information can be retrieved as required via the processing unit 20, especially by the individual program modules 21, 22, 23, 24, 25.

Although the invention was explained here on the basis of an abrupt increase in the torque in an electric drive motor for a wheel of a vehicle, it is still understood that the invention can also be applied to other risky or problematic situations, e.g. abrupt decrease in torque, reversal of torque, lock-up, oscillating torque in one or several wheels, problematic situations with respect to the steering system or braking system, short-circuits or failure of components in the electrical system or the like.

The error tolerance time can be determined in addition to the simulation for each risky or problematic situation. The error tolerance time based on the lateral and longitudinal deviations is the time that passes until the risky or problematic situation becomes uncontrollable. The error tolerance time is used in order to calculate the error reaction time which is available to the safety systems (monitoring software, ESP, . . . ) before the effect of the risky or problematic situation becomes apparent. The safety systems must be configured in such a way that the safety measures apply within the error reaction time.

The reaction of the three types of drivers (brake pedal force, steering angle, etc) is modelled depending on the respective risky or problematic situation, because each risky or problematic situation requires a different reaction. In addition, the predicted driver reaction (e.g. counter-steering) is modelled differently for each driver capability type for the same risky or problematic situation.

The invention claimed is:
1. A method for evaluating the controllability of a vehicle on a processing unit including one or more program modules, characterized by the following steps:
  a. modelling the drive train and the driving dynamics of the vehicle;
  b. modelling the situational and environmental conditions;
  c. selecting at least one driving situation;
  d. selecting at least one driver capability type, preferably from the group of inexperienced drivers, average drivers and experienced drivers;
  e. modelling the reaction of the driver as a function of the selected driver capability type;
  f. simulating the dynamic vehicle behaviour in the longitudinal and transverse directions of a planned trajectory on the basis of the drive train model and driving dynamics model for the predetermined situational and environmental conditions when the selected driving situation occurs, under the assumption of driver intervention with a reaction time which is dependent on the driver capability type;

g. calculating the maximum lateral and longitudinal deviation from the planned trajectory between the occurrence of the driving situation and the regaining of control by the driver;

h. evaluating the controllability of the vehicle by the driver in the driving situation on the basis of the maximum lateral and/or longitudinal deviation of the vehicle from the planned trajectory.

2. The method according to claim 1, wherein the vehicle is evaluated as controllable for at least the considered driver capability type if the maximum lateral and longitudinal deviations of the vehicle do not exceed defined limit values for the lateral and longitudinal deviation of the vehicle.

3. The method according to claim 1, wherein the vehicle is evaluated as generally controllable if the maximum lateral and longitudinal deviations of the vehicle for all types of drivers do not exceed defined limit values for the lateral and longitudinal deviation of the vehicle.

4. The method according to claim 2, wherein a lateral deviation of 0.5 meters outside of the lane of the planned trajectory is defined as the lateral limit value.

5. The method according to claim 1, wherein a deviation of 1.5 seconds in the longitudinal direction of the planned trajectory, relating to a planned trajectory point without the occurring driving situation, is defined as the longitudinal limit value.

6. The method according to claim 1, wherein for an inexperienced driver a reaction time of 2.3 to 2.8 seconds is used as the basis for the simulation of the dynamic vehicle behaviour.

7. The method according to claim 1, wherein for an average driver a reaction time of 1.8 to 2.1 seconds is used as the basis for the simulation of the dynamic vehicle behaviour.

8. The method according to claim 1, wherein for an experienced driver a reaction time of 1.5 to 1.8 seconds is used as the basis for the simulation of the dynamic vehicle behaviour.

9. The method according to claim 1, wherein a controllability class (C0, C1, C2) is assigned to each driver capability type.

10. The method according to claim 9, wherein the lowest controllability class of all simulated driver capability types, which do not result in the loss of vehicle control, is used as the controllability class for hazard and risk assessment.

11. The method according to claim 1, wherein the vehicle is an electric vehicle.

* * * * *